(12) United States Patent
Beasley

(10) Patent No.: US 8,531,110 B2
(45) Date of Patent: Sep. 10, 2013

(54) METHOD AND APPARATUS FOR USING THERMIONIC DEVICES TO RECOVER ENERGY FROM LIGHT SOURCES AND OTHER ENERGY CONVERSION DEVICES

(75) Inventor: Denny D. Beasley, La Grange Park, IL (US)

(73) Assignee: Robertson Transformer Co., Blue Island, IL (US)

( * ) Notice: Subject to any disclaimer, the term of this patent is extended or adjusted under 35 U.S.C. 154(b) by 164 days.

(21) Appl. No.: 13/131,198

(22) PCT Filed: Nov. 25, 2009

(86) PCT No.: PCT/US2009/065882
§ 371 (c)(1),
(2), (4) Date: Jul. 29, 2011

(87) PCT Pub. No.: WO2010/068485
PCT Pub. Date: Jun. 17, 2010

(65) Prior Publication Data
US 2011/0279037 A1 Nov. 17, 2011

Related U.S. Application Data

(60) Provisional application No. 61/117,827, filed on Nov. 25, 2008.

(51) Int. Cl.
*H01J 61/52* (2006.01)
*H01L 35/30* (2006.01)

(52) U.S. Cl.
USPC .......................................... 315/112; 136/205

(58) Field of Classification Search
None
See application file for complete search history.

(56) References Cited

U.S. PATENT DOCUMENTS

| 6,784,601 | B2 | 8/2004 | Kai et al. |
| 7,135,033 | B2 * | 11/2006 | Altshuler et al. ............... 607/88 |
| 7,138,659 | B2 | 11/2006 | Raos et al. |
| 2006/0219284 | A1 | 10/2006 | Horio et al. |
| 2007/0228999 | A1 | 10/2007 | Kit |

FOREIGN PATENT DOCUMENTS

GB 2243437 A 10/1991

OTHER PUBLICATIONS

Robertson Transform Co. International Search Report from PCT/US2009/065882 mailed Jan. 21, 2010 from the ISA/US.

* cited by examiner

*Primary Examiner* — Crystal L Hammond
(74) *Attorney, Agent, or Firm* — Conley Rose, P.C.; Grant Rodolph; John H. Scott, III

(57) ABSTRACT

A lamp having a light emitting diode, a Peltier device, a heat sink, a translucent thermally conductive window, and an optical fluid. The Peltier device is in thermal communication with the light emitting diode and converts a waste thermal energy discharged by the light emitting diode into an electrical energy. Conductors transfer the electrical energy from the Peltier device to a boost circuit which converts a level of a voltage associated with the electrical energy output from the Peltier device to a higher, more useful value. The heat sink transfers a second thermal energy from the Peltier device. The optical fluid is located between the translucent, thermally conductive window and the light emitting diode. The optical fluid has an angle of diffraction having an intermediate value relative to an angle of diffraction associated with the light emitting diode and an angle of diffraction associated with the translucent, thermally conductive window.

20 Claims, 10 Drawing Sheets

METHOD AND APPARATUS FOR USING THERMIONIC DEVICES TO RECOVER ENERGY FROM LIGHT SOURCES AND OTHER ENERGY CONVERSION DEVICES

CROSS-REFERENCE TO RELATED APPLICATION

This application is a 35 U.S.C. 371 filing from International Application No. PCT/US2009/065882 filed on Nov. 25, 2009, which claims the priority of U.S. Provisional Patent Application No. 61/117,827 filed Nov. 25, 2008, the contents of which are incorporated herein by reference.

TECHNICAL FIELD

The present invention relates to the powering and regeneration of waste heat generated by light sources. More particularly, the present invention relates a method to reclaim the thermal energy using the reclaimed energy to stabilize the operating temperature and/or generate an electrical energy.

BACKGROUND OF THE INVENTION

Wasted heat generated by the operation of light sources, including, but not limited to, light-emitting diodes (LEDs) is always a problem for light source and fixture designers. A method is needed to reclaim thermal energy.

SUMMARY OF THE INVENTION

A first aspect of the invention is directed to a lamp. The lamp comprises: a means for illumination; a means for converting a waste thermal energy from the means for illumination in thermal communication with the means for illumination, wherein the means for converting the waste thermal energy converts the waste thermal energy into an electrical energy; a means for conducting the electrical energy from the means for converting the waste thermal energy; a means for converting a level of a voltage associated with the electrical energy output from the means for converting the waste thermal energy; a heat sink for transferring a second thermal energy from the means for converting the waste thermal energy; a translucent, thermally conductive window; and an optical fluid between the translucent thermally conductive window and the means for illumination, the optical fluid having an angle of diffraction having an intermediate value relative to an angle of diffraction associated with the means for illumination and an angle of diffraction associated with the translucent, thermally conductive window.

A second aspect of the present invention is directed to a lamp comprising: a light emitting diode; a Peltier device in thermal communication with the light emitting diode wherein the Peltier device converts a waste thermal energy discharged by the light emitting diode into an electrical energy; a means for conducting the electrical energy from the Peltier device; a means for converting a level of a voltage associated with the electrical energy output from the Peltier device; a heat sink for transferring a second thermal energy from the Peltier device; a translucent, thermally conductive window; and an optical fluid between the translucent, thermally conductive window and the light emitting diode, the optical fluid having an angle of diffraction having an intermediate value relative to an angle of diffraction associated with the light emitting diode and an angle of diffraction associated with the translucent, thermally conductive window.

A third aspect of the present invention is directed to a light fixture. The light fixture comprises: a means for illumination; a housing having a chamber in which the means for illumination is at least partially within; a fluid carrying conduit in thermal communication with the means for illumination; a fluid pressure within the fluid carrying conduit, wherein wasted thermal energy from the means for illumination causes a heated fluid pressure within the fluid carrying conduit; a means for converting a thermal energy radiating from fluid pressure into an electrical energy; a means for conducting the electrical energy from the means for converting the thermal energy from the fluid pressure; a means for converting a level of a voltage associated with the electrical energy output of the means for converting the thermal energy from the fluid pressure; and a heat sink for transferring a second thermal energy from the means for converting the wasted thermal energy.

A fourth aspect of the present invention is directed to a lamp. The lamp comprises: a means for illumination; a means for converting a thermal energy to an electrical energy; and a means for conducting the electrical energy from the means for converting.

This aspect of the invention may include one or more of the following features, alone or in any reasonable combination. This aspect may further comprise: a heat sink. The means for illumination may be a light emitting diode in thermal communication with the means for converting the thermal energy, and a waste thermal energy from the light emitting diode may be transferred to the means for converting the thermal energy. The heat sink may receive a second thermal energy from the means for converting the thermal energy. This aspect may further comprise: a translucent thermally, conductive window. This aspect may further comprise: an optical fluid between the translucent, thermally conductive window and the means for illumination. This aspect may further comprise: a fluid carrying conduit in thermal communication with the means for illumination; and a fluid pressure within the fluid carrying conduit, wherein the fluid pressure is adapted to receive a transfer of a thermal energy from the means for illumination. The fluid pressure may be in thermal communication with the means for converting a waste thermal energy to an electrical energy, a thermal energy may be transferable from the fluid pressure to the means for converting a waste thermal energy to an electrical energy. This aspect may further comprise: a means for converting a level of a voltage associated with the electrical energy output of the means for converting the thermal energy. This aspect may further comprise: a microcontroller for controlling an operation of the means for converting a level of a voltage. The means for converting a level of a voltage may be a boost circuit, wherein a voltage associated with the electrical energy output of the means for converting the thermal energy is increased to a second voltage by the boost circuit. This aspect may further comprise: a reflector defining a chamber in which the means for illumination is at least partially within, the means for illumination being a metal halide lamp; a fluid carrying conduit, in thermal communication with the means for illumination; a fluid pressure within the fluid carrying conduit, wherein the fluid pressure is adapted to receive a transfer of a thermal energy from metal halide lamp, wherein the fluid pressure is in thermal communication with the means for converting a waste thermal energy to an electrical energy, and wherein a thermal energy is transferable from the fluid pressure to the means for converting a waste thermal energy to an electrical energy; and a means for converting a level of a voltage associated with the electrical energy output of the means for converting the thermal energy.

Another aspect of the present invention is directed to a method to extract thermal energy from lighting fixtures. The method comprises the step of: using a plurality of modes of recovery comprising thermal couples, fluids used in a Carnot cycle and Peltier generators, wherein the extracted thermal energy is used to either improve the overall operational cycle efficiency or fixture thermal management.

This aspect of the invention may include one or more of the following features, alone or in any reasonable combination. A thermal flow may be directed through a thermal-electrical recovery device comprising a Peltier junction, wherein the plurality of modes direct a thermal energy flow from a means for illumination to a heat sinking reservoir. A recovered energy may be reconverted to usable energy/voltage levels and recycled to a power input to the means for illumination and reused in a primary function of the light fixture. A boost circuit may be provided to increase a recovered energy level to a usable level by the light fixture. The light fixture may include a flat clear thermal conducting material to laterally redirect a thermal energy to a recovery area. A fluid having an intermediate index of refraction may be adapted to increase an optical transfer between layers. One quarter wave coatings may be used to reduce internal reflections. The recovered energy may be used to operate auxiliary attachments to enhance, communicate or redirect energy flows in and around a prime source operating object. The recovered energy may be divided between enhancement functions and regeneration to a prime source operating object. A thermal energy from the means for illumination may be used either summated or fractionalized to drive a working fluid in a Carnot-type thermal cycle for altering a local thermal gradient to enhance work space via recovered energies. A thermal energy stored in the working fluid may be stored for time displaced usage or other recovery via low head turbines or other methods of thermal-fluid manipulation.

BRIEF DESCRIPTION OF THE DRAWINGS

To understand the present invention, it will now be described by way of example, with reference to the accompanying drawings in which.

DETAILED DESCRIPTION

Figure 1:
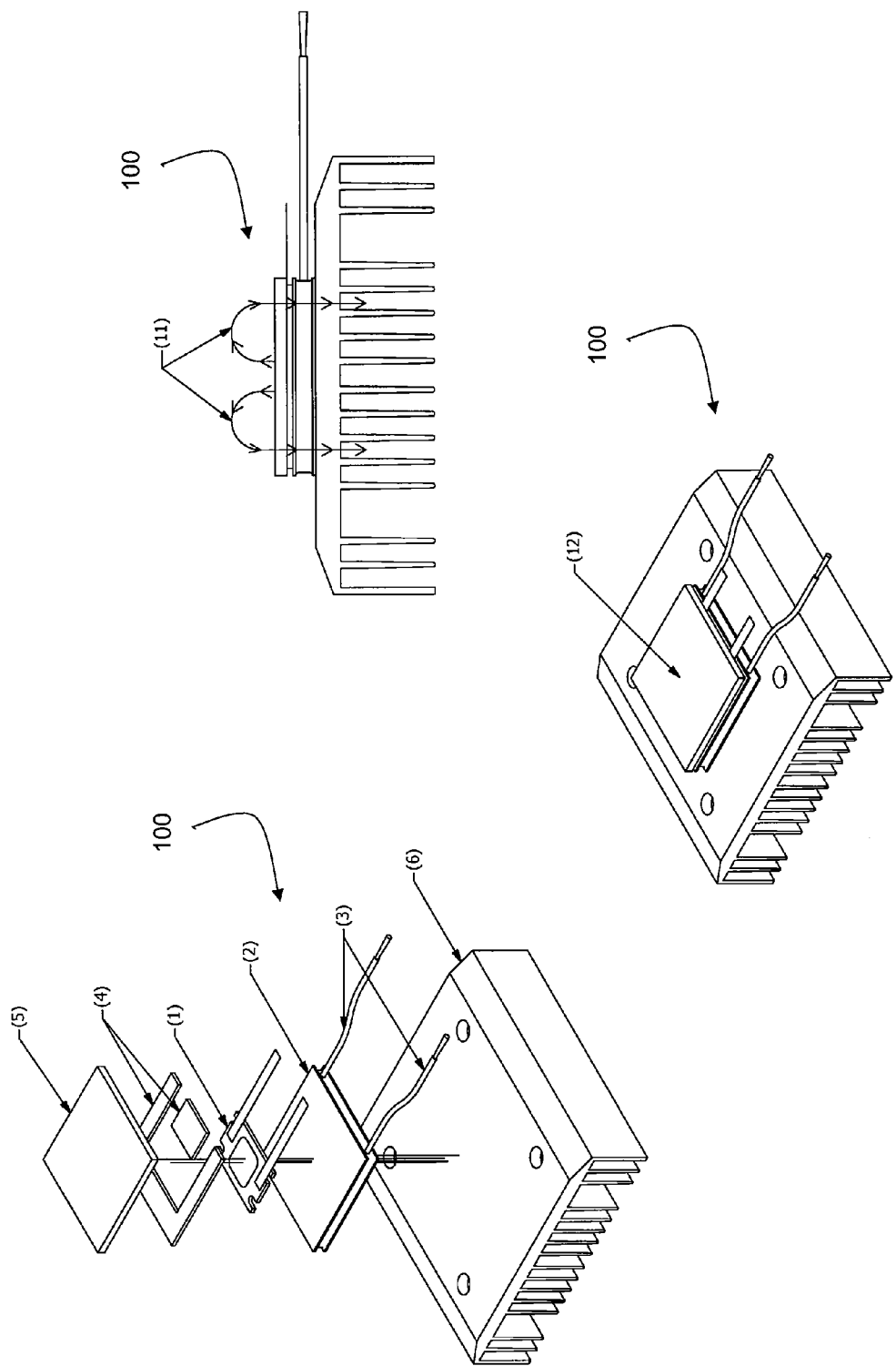
FIG. 1 is a mechanical scenario showing an LED mounted to a Peltier junction.

While this invention is susceptible of embodiments in many different forms, there is shown in the drawings and will herein be described in detail preferred embodiments of the invention with the understanding that the present disclosure is to be considered as an exemplification of the principles of the invention and is not intended to limit the broad aspect of the invention to the embodiments illustrated.

The present invention relates to the powering and regeneration of waste heat generated by light sources. The invention includes a method to reclaim a thermal energy from any heat source to mechanical or electrical conversion technique and then using the reclaimed energy to: 1) use the reclaimed energy to keep the light source in a state of ideal operational equilibrium such as stabilize the operating temperature via a fan of or other devices powered from the waste heat; and 2) convert the waste heat to an electrical energy to a level that a lamp drive can reuse and improve the system efficiency—how much light for a given input wattage.

Methods for conversion of heat energy are well known in the art. Examples of such methods include thermopiles comprising a plurality of thermocouples, Peltier devices, and secondary conversion methods such as phase changes in a working fluid—the working fluid being used to drive other cooling or generating means. A readily available mechanism is a Peltier junction.

Referring to FIG. 1, a device 100 of the present invention is illustrated. This device 100 comprises, a light emitting diode ("LED") 1 mounted, or electrically joined, by any good thermal conductive means to a heat converting means, preferably a Peltier device 2 having voltage output leads 3, thermal conductors such as heat conducting channels 4, a translucent, thermally conductive window 5, and a heat sink 6. This device includes a front side cooling method of the LED junction 1 via the translucent, thermally conductive window 5, which is preferably optically clear, and a redirection of the thermal energy to the heat converting means 2 through heat conducting channels 4. No conversion method is 100% in its operation so a heat will be typically given off to remove what remains of the unconverted energies.

In FIG. 1, the translucent, thermally conductive window 5 is immediately in front of, and in contact with, a front side of the LED 1. The contact may be the front side window alone or in conjunction with an optical fluid 12 to reduce boundary reflection in the optical transmission path. This optical conduction matching is accomplished by providing a medium that has an angle of diffraction that is of an intermediate value to the path rough the LED 1 optical path and the translucent, thermally conductive window's 5 value.

Figure 2:
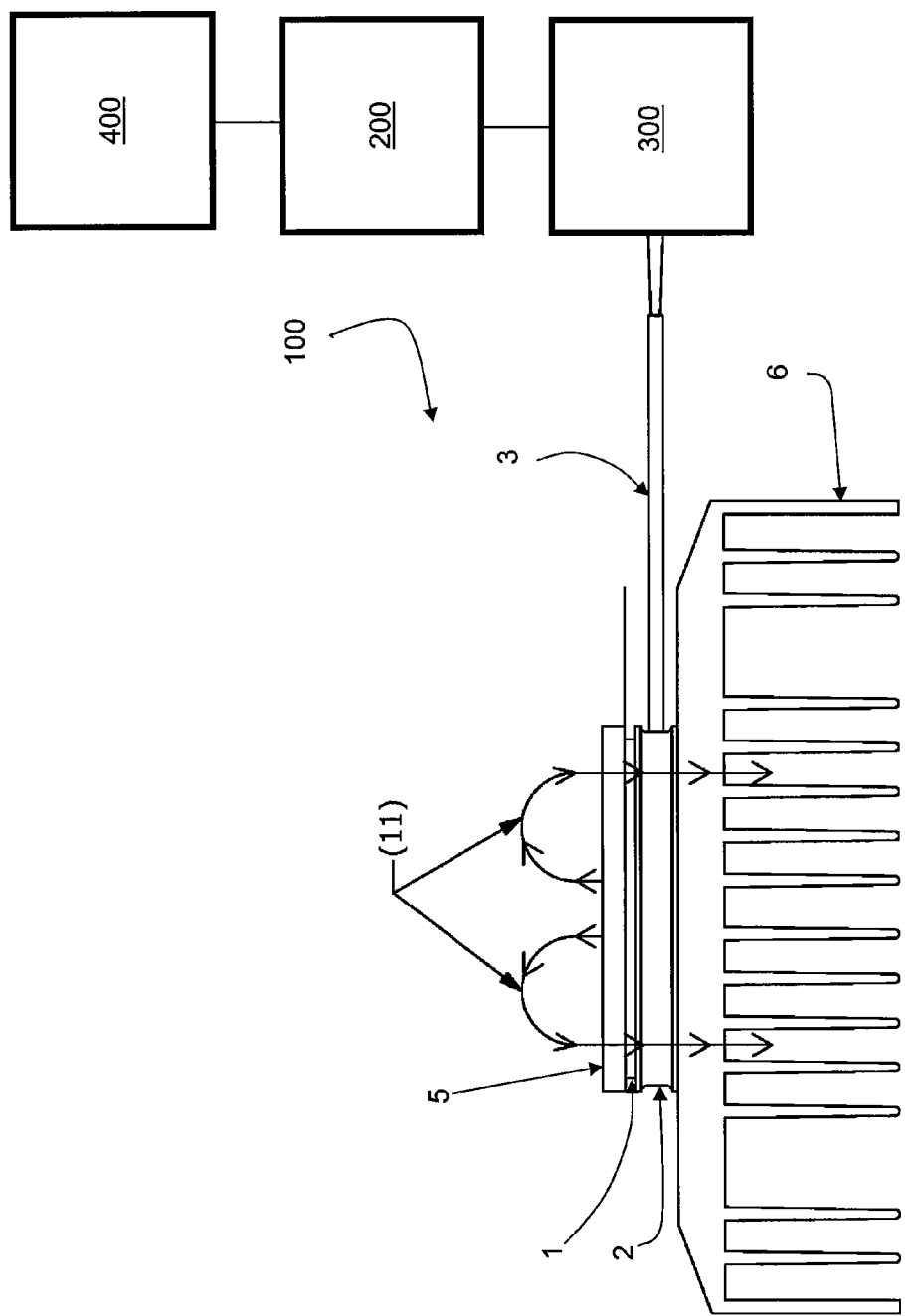
FIG. 2 is a block diagram of an energy flow in the mechanical apparatus.

FIG. 2 shows the flow of heat energies 11 in the above device 100. In this case, a heat source, the LED 1, is shown attached to a conversion platform with a heat sink 6 for un-captured heat removal. Peltier junctions 2 have thermal differentials of about, but not limited to, 10 to 100 degrees Celsius. This differential created by the heat source 1 and the heat energy flows is characterized by a quantity $E_{source}$. As shown in FIG. 2, the heat energy flows 11 from a greater temperature to a lower temperature. In creating this thermal disequilibrium and resulting heat flow 11, the Peltier junction 2 extracts a part of this heat energy flow 11 as electrical energy. Equation 10 shows the energy balance of the operation $E_e$ is the portion of the energy flow 11 made available.

$$E_{source} = E_e + E_{sink} \quad (10)$$

This action has the ancillary effect of reducing size and cost of heat sinks to remove the un-captured heat by a level proportional to the amount of energy conducted out of the flow as electrical energy.

In addition, since the Peltier junction 2 is typically symmetric in its operation from heat-to-electrical conversion, it can be used as an electrical-to-heat device. In this case, stored energy would be used to drive heat away from the system shown in FIG. 1. The purpose of this is to actively stabilize the LED 1 temperatures where the Peltier junction 2 is driven to as to produce a thermal gradient that enhances heat flow away from the Peltier junction 2 for short periods of times if the LED 1 were pushed close to non-optimal operation.

Figure 3:
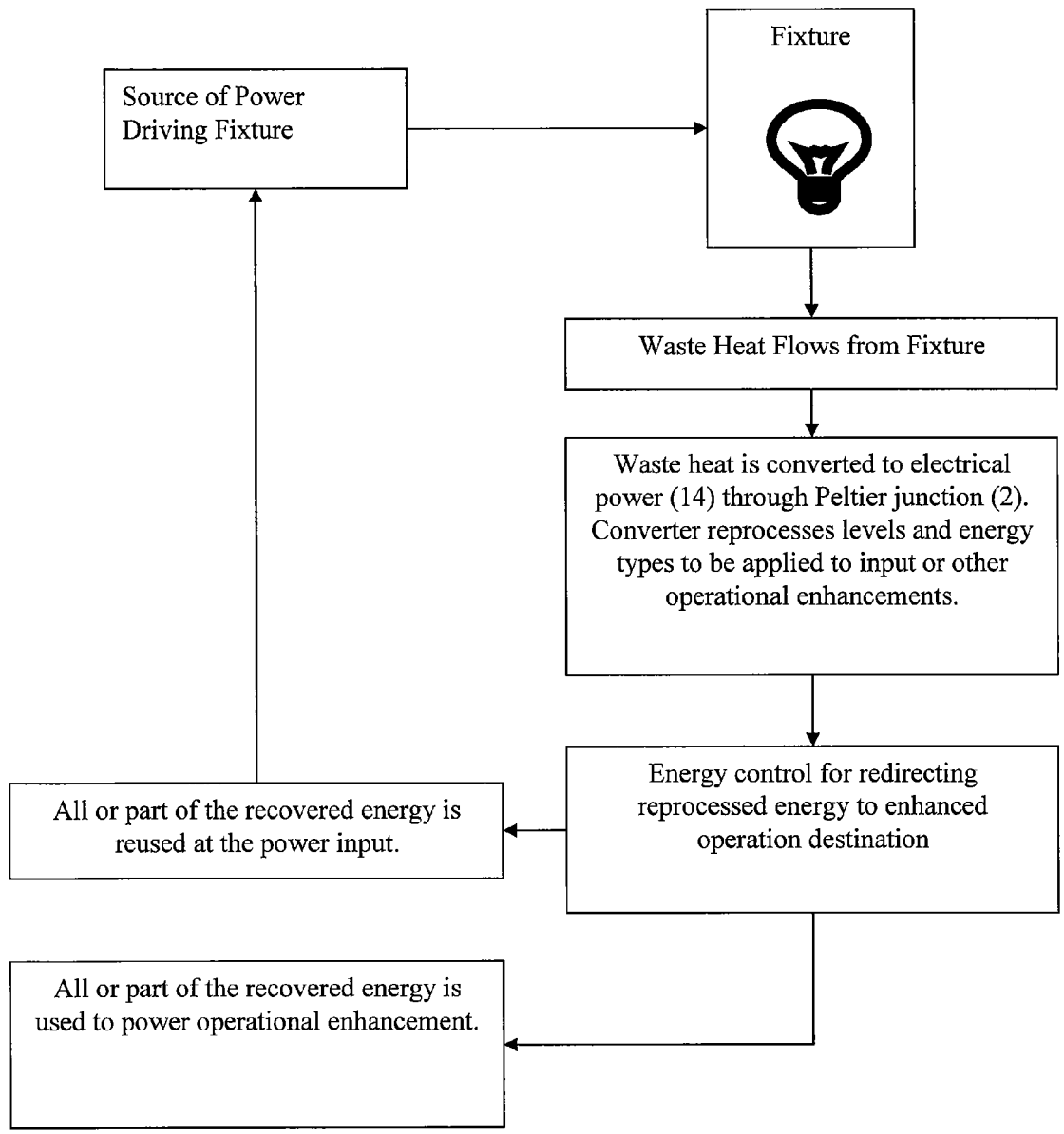
FIG. 3 is an illustration of a recovered energy being fed to a conversion means.

FIG. 3 is flow diagram showing the voltage leads from the a Peltier junction (e.g. Peltier junction 2) being applied to a converter to transform the energy to a level where it is regenerated into to a power input supplying a light source power supply. The transformation is by any number of boosting or bucking techniques known in the art.

Figure 4:
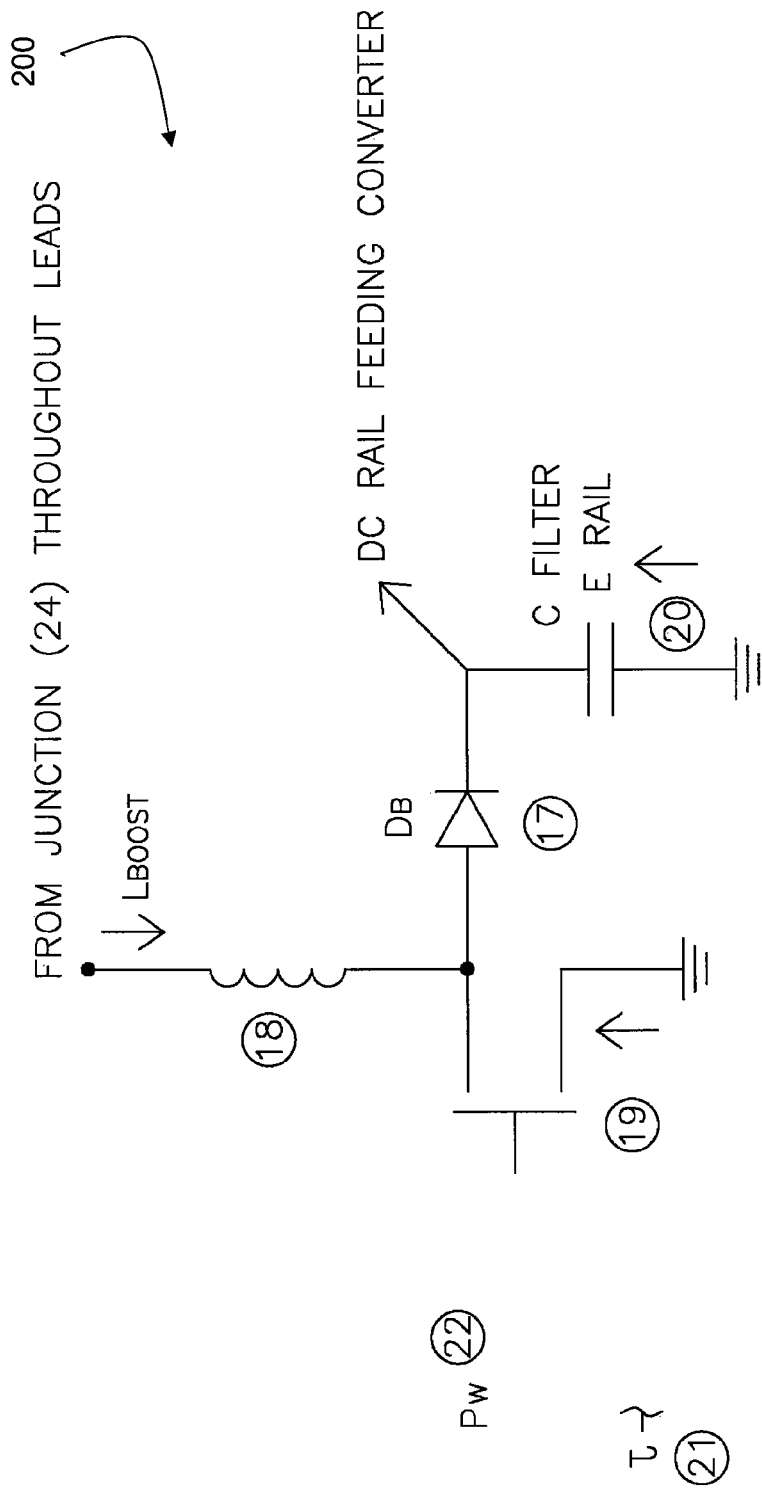
FIG. 4 is a circuit diagram showing a method of energy possible conversion technique.

A boost converter 200 as illustrated in FIG. 4 is one method the recovered energy may be boosted to a new level. The voltage from a Peltier junction (e.g. Peltier junction 2) causes current to flow into an inductor $L_{Boost}$ 18 during an on-time of a switching element 19. A gate voltage 21 is applied to initiate conduction in the switching element 19 for a period of time to store energy derived from the Peltier junction 2. Capacitor 20 is provided to store energy. Diode 17 redirects the energy onto the capacitor 20.

The on-time $P_W$ 22 is controlled by any number of control schemes known in the art to control the boost cycle for optimal energy transfer. However, maximum energy transformation, as derived from the maximum energy transfer, specifies that when the voltage drop across the load is equal to the voltage drop across the internal series impedance.

Figure 5:
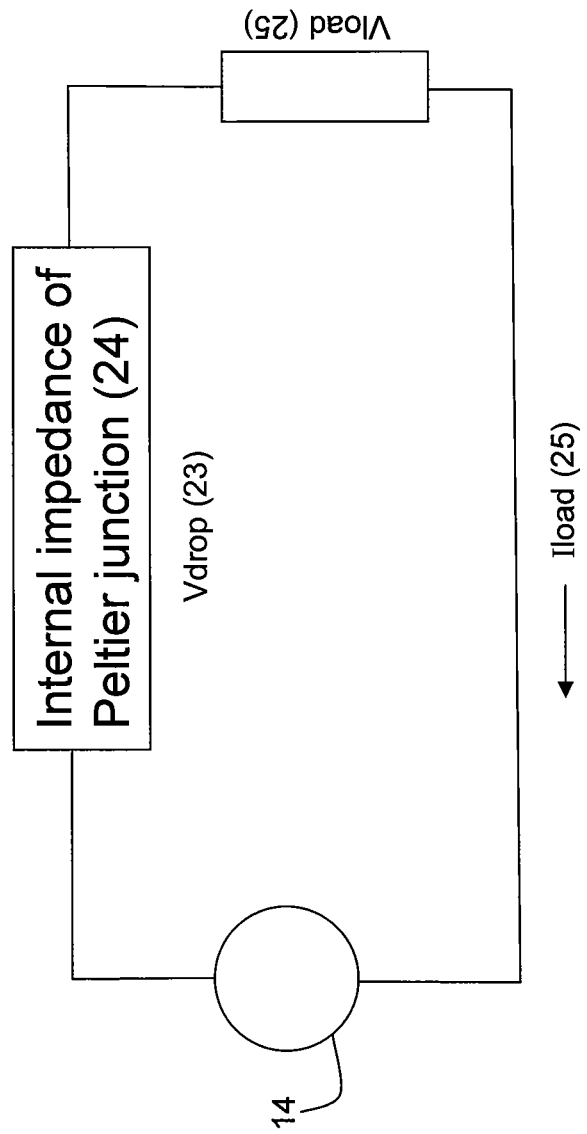
FIG. 5 is a block diagram illustrating a maximum energy transfer criteria.

FIG. 5 illustrates an equivalent circuit for the Peltier junction 2. A generated voltage (Vj) 14 is a voltage generated by the junction in series with a series impedance 24. This supplies energy to a load impedance (Rload) 25.

Figure 6:
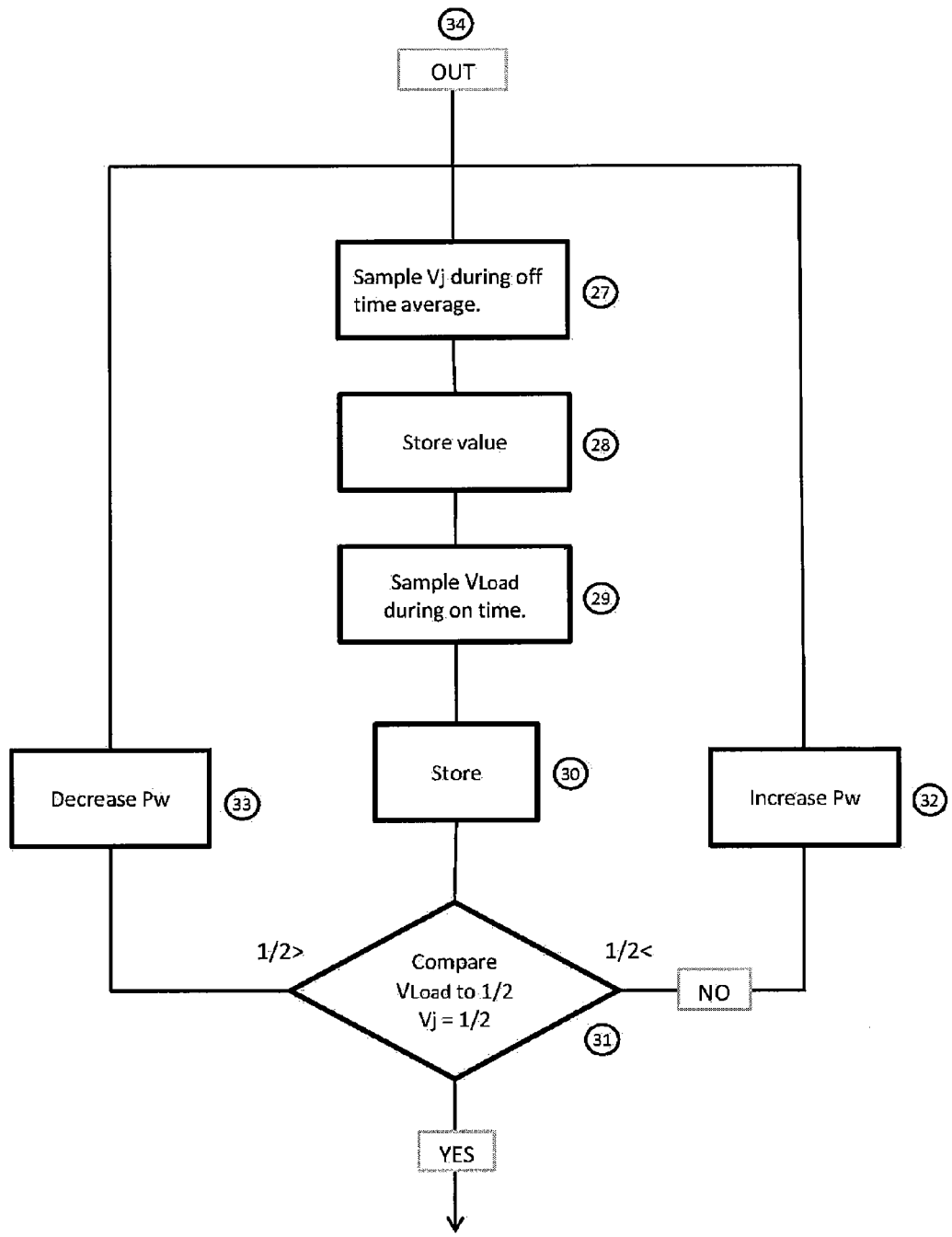
FIG. 6 is a flowchart for a maximum power transfer.

To actively achieve maximum transfer, the boost converter 200 of FIG. 4 could be driven from a microcontroller 300 (see FIG. 2) using the program flow shown in FIG. 6. An open circuit sample 27 would be taken while Vj 14 is not loaded, e.g. the off time of the gate drive, taking a reading of the unloaded source Vj 14. This value would be averaged and stored as an open circuit value 28. When the gate drive is present, another sample would be made to capture a loaded value 29 that would represent the time variant load that a circuit will represent to the Peltier source of FIG. 5. A single sample at the midpoint of the drive cycle or a series of samples averaged over the entire on-time of the gate drive can yield an indication of a loading factor for operation at maximum transfer. This loaded value 29 is then stored 30. A comparison step 31 is then conducted to see if the loaded value 29 is half of the open circuit sample 27. The decision tree would either direct the drive to increase the gate drive on-time (i.e. duty cycle) to increase 32 the of Vj 14, decrease the gate drive on-time to decrease 33 the loading of Vj 14, or make no adjustment and loop back to the beginning 34 and continue monitoring.

Output from the boost circuit may be used to power external elements 400 (see FIG. 2), such as fans, other illuminating means, circuits, microprocessors, etc.

Figure 7:
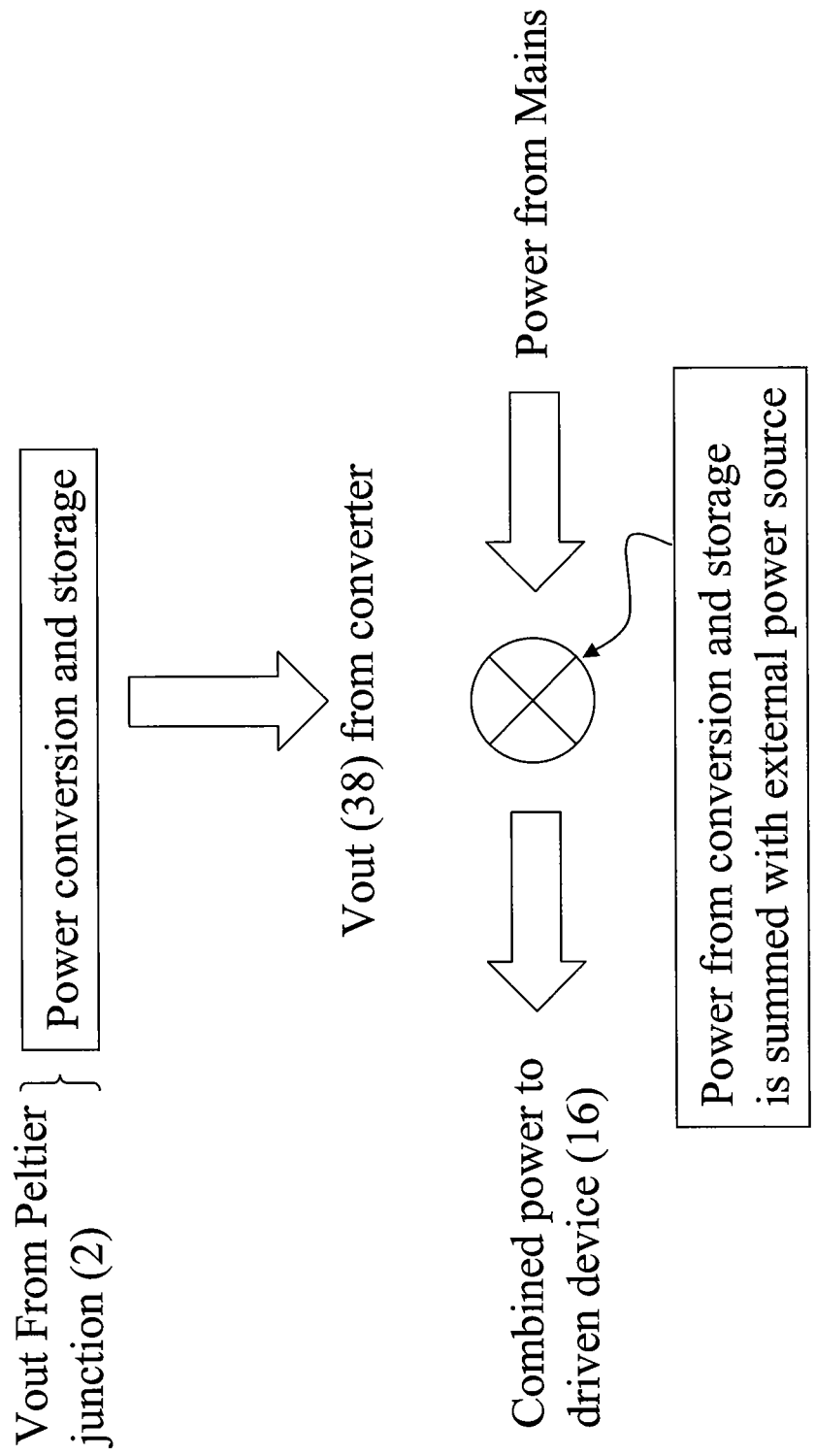
FIG. 7 is a diagram illustrating a converted energy used for emergency lighting and forced cooling.

FIG. 7 shows a configuration where the output 38 of a Peltier junction (e.g. Peltier junction 2) is fed into a converter that can either direct the energy into a storage device, e.g., but not limited to, a battery. Should the battery become completely charged, the excess could then be regenerated into a power input supplying a light source power supply as previously described. Should power be lost, the circuit could switch its power source to the energy stored in the batteries.

Figure 8:
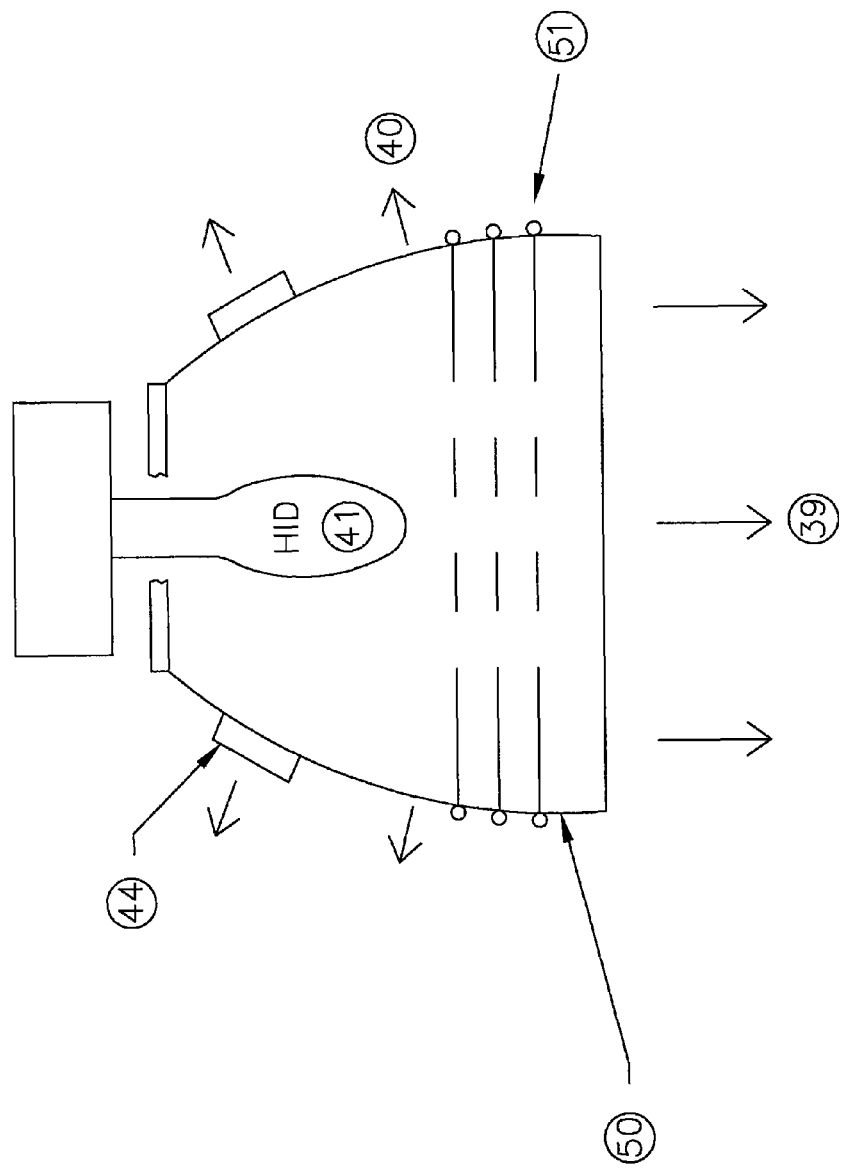
FIG. 8 is a diagram illustrating a fixture showing two scenarios with Peltier junctions 44 and with heat exchanger with working fluid pipes.
Figure 9:
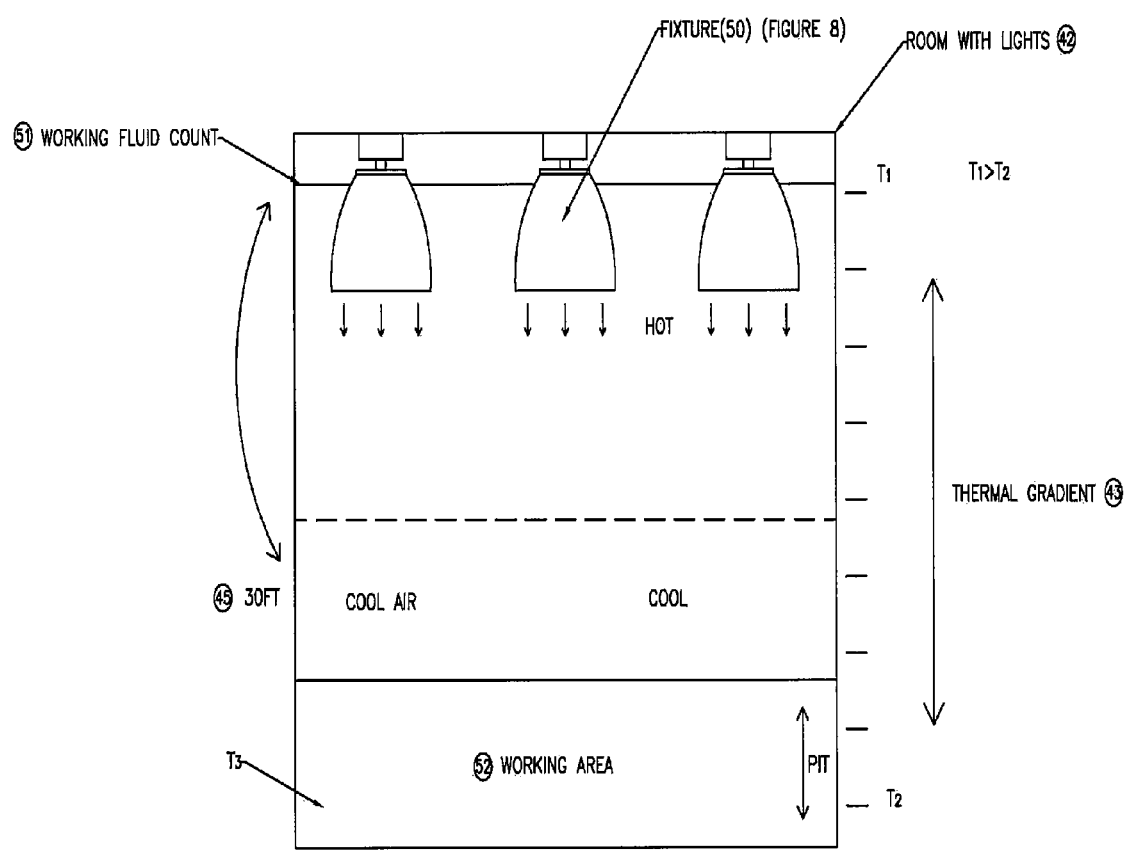
FIG. 9 is a diagram of a room showing thermal gradient with lighting fixtures 50 working fluid conduits 51 and heat exchanger 45 for creating exaggerated thermal gradient at lower working level 52.

Referring to FIGS. 8 and 9, another application of heat recycling may be used in conjunction with high intensity light sources (HID) such as metal halide lamps. Each lamp could be a source for hundreds of watts. One implementation could be Peltier junctions 44 mounted to a reflector 50 defining a chamber in which the lamp is at least partially housed. As described above, the Peltier junctions 44 feed the recovered energy to a lamp drive circuit or use a direct form of conversion to use the waste heat for another purpose such as thermally stratifying a working area. This can work in an installation or room 42 with high ceilings where most HID lighting is located, as illustrated in FIG. 9. A thermal gradient 43 will naturally occur in any space with heat sources. The temperature T1 and T2 in the thermal gradient 43, if not actively interfered with, will be such that T1 will be greater than T2. An effect caused by lower density hot air rising and higher density colder air falling. To assure that the most heat is directed to the Peltier junctions 44, a method may be employed to conduct heat away from the source from 2 sides of a light source 41. This method can be used to cool a work area 52.

Figure 10:
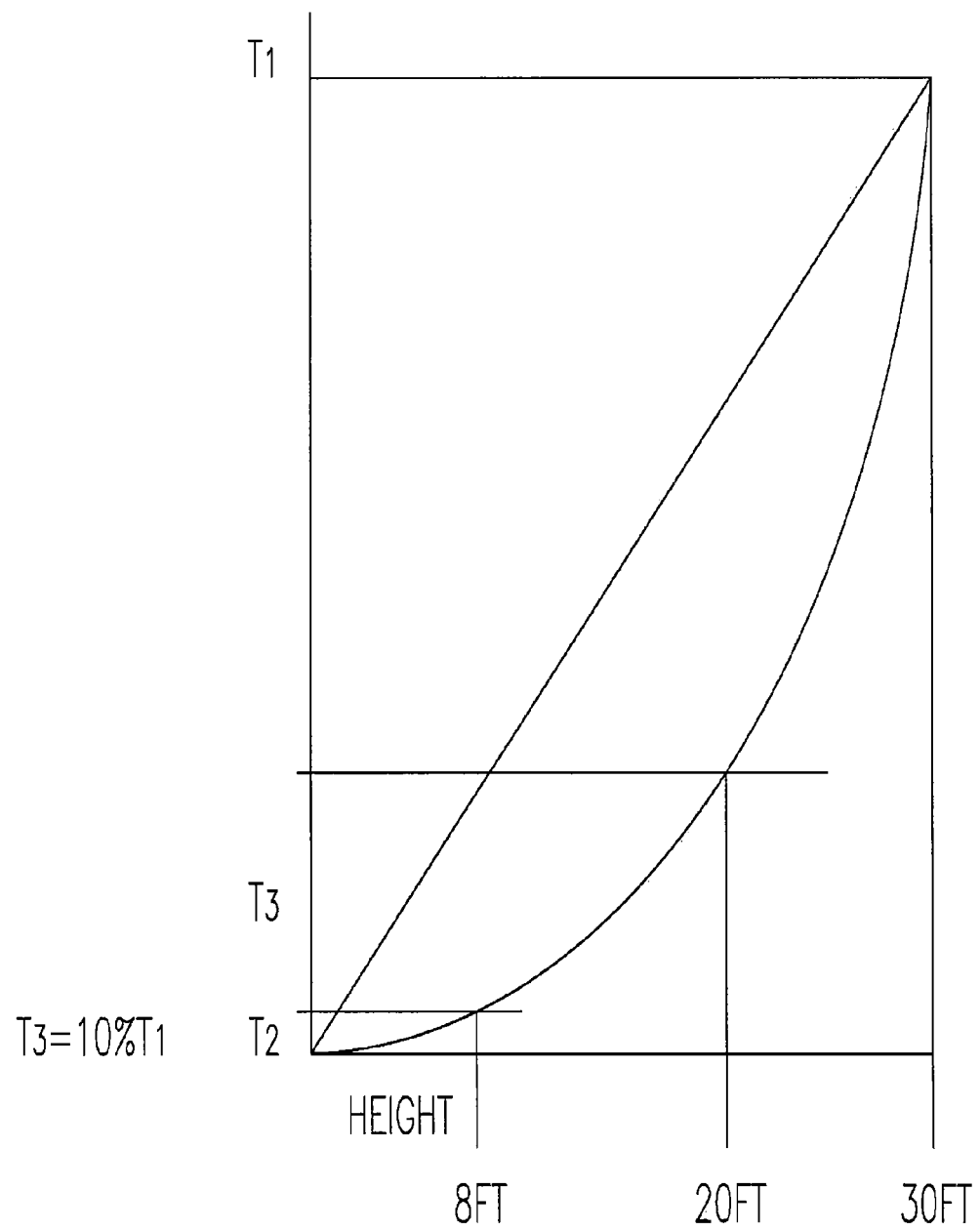
FIG. 10 is a graph showing natural thermal gradient 46 in a room in FIG. 9 and an exaggerated distribution by recapturing waste heat to drive heat exchanger 45.

FIG. 10 shows two gradients 46 and 47. In gradient 46, a native thermal distribution is seen providing a uniform distribution from a floor temperature to a ceiling temperature. In gradient 47, the gradient has a small increase in the early part of the curve then increases more quickly as the height increases. The gradient illustration shows that it could be possible to accentuate the gradient at reduced heights 8 feet and below where people work while at the same time not changing the net gradient significantly. This is achievable by running a working fluid through the reflector 50 as shown in FIG. 8, for example by a fluid pressure within a conduit 51 in thermal communication with the light source 41. This fluid is of a typical type used in Carnot cycle refrigeration systems; however, its energy source is the waste heat or thermal energy of the HID lighting much like refrigerators that use a natural gas heat source for cooling. The arrangement is shown in FIG. 9, the fixtures 50 would heat and pressurize the working fluid where it would be directed to cooling component 45 of the Carnot cycle device. This cold air would be released at the lower level creating a cold strata and thereby create the exaggerated gradient of FIG. 10 gradient 47.

While the specific embodiments have been illustrated and described, numerous modifications come to mind without significantly departing from the spirit of the invention and the scope of protection is only limited by the scope of the accompanying Claims.

What is claimed is:
1. A lamp comprising:
   a means for illumination;
   a means for converting a waste thermal energy from the means for illumination in thermal communication with the means for illumination, wherein the means for converting the waste thermal energy converts the waste thermal energy into an electrical energy;
   a means for conducting the electrical energy from the means for converting the waste thermal energy;
   a means for converting a level of a voltage associated with the electrical energy output from the means for converting the waste thermal energy;
   a heat sink for transferring a second thermal energy from the means for converting the waste thermal energy;
   a translucent thermally conductive window; and
   an optical fluid between the translucent thermally conductive window and the means for illumination, the optical fluid having an angle of diffraction having an intermediate value relative to an angle of diffraction associated with the means for illumination and an angle of diffraction associated with the translucent thermally conductive window, wherein a recovered energy is converted to usable voltage levels and recycled to a power input to the means for illumination and reused in a primary function of the lamp.

2. The lamp of claim 1, wherein the means for illumination is a light emitting diode, wherein the means for converting a waste thermal energy is a Peltier device in thermal communication with the light emitting diode, and wherein the Peltier device converts a waste thermal energy discharged by the light emitting diode into an electrical energy.

3. The lamp of claim 1, wherein the means for illumination is a light emitting diode in thermal communication with the means for converting the waste thermal energy.

4. The lamp of claim 1 further comprising:
a fluid carrying conduit in thermal communication with the means for illumination; and
a fluid pressure within the fluid carrying conduit, wherein the fluid pressure is adapted to receive a transfer of a thermal energy from the means for illumination.

5. The lamp of claim 4, wherein the fluid pressure is in thermal communication with the means for converting a waste thermal energy to an electrical energy, and wherein a thermal energy is transferable from the fluid pressure to the means for converting a waste thermal energy to an electrical energy.

6. The lamp of claim 1 further comprising a microcontroller for controlling an operation of the means for converting a level of a voltage.

7. The lamp of claim 6, wherein the means for converting a level of a voltage is a boost circuit, and wherein the level of the voltage associated with the electrical energy output of the means for converting the thermal energy is increased to a second voltage by the boost circuit.

8. The lamp of claim 1 further comprising:
a reflector defining a chamber in which the means for illumination is at least partially within the means for illumination being a metal halide lamp;
a fluid carrying conduit in thermal communication with the means for illumination; and
a fluid pressure within the fluid carrying conduit, wherein the fluid pressure is adapted to receive a transfer of a thermal energy from metal halide lamp, wherein the fluid pressure is in thermal communication with the means for converting a waste thermal energy to an electrical energy, and wherein a thermal energy is transferable from the fluid pressure to the means for converting a waste thermal energy to an electrical energy.

9. A method to extract thermal energy from lighting fixtures comprising the step of:
using one or more modes of recovery comprising thermal couples, fluids used in a Carnot cycle, and Peltier generators,
wherein the extracted thermal energy is used to either improve an overall operational cycle efficiency of the means for illumination or fixture thermal management.

10. The method of claim 9, wherein a thermal flow is directed through a thermal-electrical recovery device comprising a Peltier junction, and wherein a plurality of modes direct a thermal energy flow from the means for illumination to a heat sinking reservoir.

11. The method of claim 10, wherein a recovered energy is reconverted to usable energy/voltage levels and recycled to a power input to the means for illumination and reused in a primary function of the light fixture.

12. The method of claim 11, wherein a boost circuit is provided to increase a recovered energy level to a usable level by the light fixture.

13. The method of claim 9, wherein the light fixture includes a flat clear thermal conducting material to laterally redirect a thermal energy to a recovery area, and wherein the light fixture comprises a plurality of layers.

14. The method of claim 9, wherein a fluid having an intermediate index of refraction adapted to increase an optical transfer between the layers.

15. The method of claim 14, wherein a ¼ wave coating is provided to reduce internal reflections.

16. The method of claim 10, wherein a recovered energy from the light fixture is used to operate auxiliary attachments to enhance, communicate, or redirect energy flows in and around a prime source operating object.

17. The method of claim 16, wherein the recovered the energy is divided between enhancement functions and regeneration to the prime source operating object.

18. The method of claim 10, wherein a thermal energy from the means for illumination is used either summated or fractionalized to drive a working fluid in a Carnot-type thermal cycle for altering a local thermal gradient to enhance work space via recovered energies.

19. The method of claim 18, wherein a thermal energy stored in the working fluid is stored for time displaced usage or other recovery via low head turbines or other thermal-fluid manipulators.

20. A light fixture comprising:
a means for illumination;
a housing having a chamber in which the means for illumination is at least partially within;
a fluid carrying conduit in thermal communication with the means for illumination;
a fluid pressure within the fluid carrying conduit wherein a wasted thermal energy from the means for illumination causes a heated fluid pressure within the fluid carrying conduit;
a means for converting a thermal energy radiating from the fluid pressure into an electrical energy;
a means for conducting the electrical energy from the means for converting the thermal energy from the fluid pressure;
a means for converting a level of a voltage associated with the electrical energy output of the means for converting the thermal energy radiating from the fluid pressure; and
a heat sink for transferring a second thermal energy from the means for converting the wasted thermal energy.

* * * * *

UNITED STATES PATENT AND TRADEMARK OFFICE
CERTIFICATE OF CORRECTION

PATENT NO. : 8,531,110 B2
APPLICATION NO. : 13/131198
DATED : September 10, 2013
INVENTOR(S) : Denny D. Beasley It is certified that error appears in the above-identified patent and that said Letters Patent is hereby corrected as shown below:

Title Page, (57) Abstract, should read as:
"A lamp having a light emitting diode, a Peltier device, a heat sink, a translucent, thermally conductive window, and an optical fluid. The Peltier device is in thermal communication with the light emitting diode and converts a waste thermal energy discharged by the light emitting diode into an electrical energy. Conductors transfer the electrical energy from the Peltier device to a boost circuit which converts a level of a voltage associated with the electrical energy output from the Peltier device to a higher, more useful value. The heat sink transfers a second thermal energy from the Peltier device. The optical fluid is located between the translucent, thermally conductive window and the light emitting diode. The optical fluid has an angle of diffraction having an intermediate value relative to an angle of diffraction associated with the light emitting diode and an angle of diffraction associated with the translucent, thermally conductive window."

In the Specification

Column 1, lines 17-22, should read as:
"The present invention relates to the powering and regeneration of waste heat generated by light sources. More particularly, the present invention relates to a method to reclaim the thermal energy using the reclaimed energy to stabilize the operating temperature and/or generate an electrical energy."

Column 1, lines 33-51, should read as:
"A first aspect of the invention is directed to a lamp. The lamp comprises: a means for illumination; a means for converting a waste thermal energy from the means for illumination in thermal communication with the means for illumination, wherein the means for converting the waste thermal energy converts the waste thermal energy into an electrical energy; a means for conducting the electrical energy from the means for converting the waste thermal energy; a means for converting a level of a voltage associated with the electrical energy output from the means for converting the waste thermal energy; a heat sink for transferring a second thermal energy from the means for converting the waste thermal energy; a translucent, thermally conductive window; and an optical fluid between the translucent, thermally conductive window and the means for illumination, the optical fluid having an Signed and Sealed this
Twenty-ninth Day of April, 2014

Michelle K. Lee
*Deputy Director of the United States Patent and Trademark Office* angle of diffraction having an intermediate value relative to an angle of diffraction associated with the means for illumination and an angle of diffraction associated with the translucent, thermally conductive window."

Column 2, lines 23-67, should read as:
"This aspect of the invention may include one or more of the following features, alone or in any reasonable combination. This aspect may further comprise: a heat sink. The means for illumination may be a light emitting diode in thermal communication with the means for converting the thermal energy, and a waste thermal energy from the light emitting diode may be transferred to the means for converting the thermal energy. The heat sink may receive a second thermal energy from the means for converting the thermal energy. This aspect may further comprise: a translucent, thermally conductive window. This aspect may further comprise: an optical fluid between the translucent, thermally conductive window and the means for illumination. This aspect may further comprise: a fluid carrying conduit In thermal communication with the means for illumination; and a fluid pressure within the fluid carrying conduit, wherein the fluid pressure is adapted to receive a transfer of a thermal energy from the means for illumination. The fluid pressure may be in thermal communication with the means for converting a waste thermal energy to an electrical energy, a thermal energy may be transferable from the fluid pressure to the means for converting a waste thermal energy to an electrical energy. This aspect may further comprise: a means for converting a level of a voltage associated with the electrical energy output of the means for converting the thermal energy. This aspect may further comprise: a microcontroller for controlling an operation of the means for converting a level of a voltage. The means for converting a level of a voltage may be a boost circuit, wherein a voltage associated with the electrical energy output of the means for converting the thermal energy is increased to a second voltage by the boost circuit. This aspect may further comprise: a reflector defining a chamber in which the means for illumination is at least partially within, the means for illumination being a metal halide lamp; a fluid carrying conduit in thermal communication with the means for illumination; a fluid pressure within the fluid carrying conduit, wherein the fluid pressure is adapted to receive a transfer of a thermal energy from metal halide lamp, wherein the fluid pressure is in thermal communication with the means for converting a waste thermal energy to an electrical energy, and wherein a thermal energy is transferable from the fluid pressure to the means for converting a waste thermal energy to an electrical energy; and a means for converting a level of a voltage associated with the electrical energy output of the means for converting the thermal energy."

Column 3, lines 37-62, should read as:
"To understand the present invention, it will now be described by way of example, with reference to the accompanying drawings in which:
    FIG. 1 is a mechanical scenario showing an LED mounted to a Peltier junction;
    FIG. 2 is a block diagram of an energy flow in the mechanical apparatus;
    FIG. 3 is an illustration of a recovered energy being fed to a conversion means;
    FIG. 4 is a circuit diagram showing a method of energy possible conversion technique;
    FIG. 5 is a block diagram illustrating a maximum energy transfer criteria;
    FIG. 6 is a flowchart for a maximum power transfer;

FIG. 7 is a diagram illustrating a converted energy used for emergency lighting

CERTIFICATE OF CORRECTION (continued)
U.S. Pat. No. 8,531,110 B2 and forced cooling;
FIG. 8 is a diagram illustrating a fixture showing two scenarios with Peltier junctions 44 and with heat exchanger with working fluid pipes;
FIG. 9 is a diagram of a room showing thermal gradient with lighting fixtures 50 working fluid conduits 51 and heat exchanger 45 for creating exaggerated thermal gradient at lower working level 52; and
FIG. 10 is a graph showing natural thermal gradient 46 in a room in FIG. 9 and an exaggerated distribution by recapturing waste heat to drive heat exchanger 45."

Column 4, lines 24-37, should read as:
"Referring to FIG. 1, a device 100 of the present invention is illustrated. This device 100 comprises, a light emitting diode ("LED") 1 mounted, or electrically joined, by any good thermal conductive means to a heat converting means, preferably a Peltier device 2 having voltage output leads 3, thermal conductors such as heat conducting channels 4, a translucent, thermally conductive window 5, and a heat sink 6. This device includes a front side cooling method of the LED junction 1 via the translucent, thermally conductive window 5, which is preferably optically clear, and a redirection of the thermal energy to the heat converting means through heat conducting channels 4. No conversion method is 100% in its operation so a heat will be typically given off to remove what remains of the unconverted energies."

Column 5, lines 8-13, should read as:
"FIG. 3 is flow diagram showing the voltage leads from a Peltier junction (e.g. Peltier junction 2) being applied to a converter to transform the energy to a level where it is regenerated into to a power input supplying a light source power supply. The transformation is by any number of boosting or bucking techniques known in the art."

In the Claims

Column 6, lines 46-67, through column 7, lines 1-4, claim 1, should read as:
"1. A lamp comprising:
a means for illumination;
a means for converting a waste thermal energy from the means for illumination in thermal communication with the means for illumination, wherein the means for converting the waste thermal energy converts the waste thermal energy into an electrical energy;
a means for conducting the electrical energy from the means for converting the waste thermal energy;
a means for converting a level of a voltage associated with the electrical energy output from the means for converting the waste thermal energy;
a heat sink for transferring a second thermal energy from the means for converting the waste thermal energy;
a translucent, thermally conductive window; and an optical fluid between the translucent, thermally conductive window and the means for illumination, the optical fluid having an angle of diffraction having an intermediate value relative to an angle of diffraction associated with the means for illumination and an angle of diffraction associated with the translucent, thermally conductive window,
wherein a recovered energy is converted to usable voltage levels and recycled to a power input to the means for illumination and reused in a primary function of the lamp."

Column 7, lines 48-55, claim 9, should read as:
"9. A method to extract thermal energy from lighting fixtures comprising the step of:
using one or more modes of recovery comprising thermal couples, fluids used in a Carnot cycle, and Peltier generators,
wherein the extracted thermal energy is used to either improve an overall operational cycle efficiency of the means for illumination or fixture thermal management."

Column 8, lines 18-20, claim 15, should read as:
"15. The method of claim 14, wherein a one quarter wave coating is provided to reduce internal reflections."

Column 8, lines 24-27, claim 17, should read as:
"17. The method of claim 16, wherein the recovered energy is divided between enhancement functions and regeneration to the prime source operating object."